(12) United States Patent
Charm et al.

(10) Patent No.: US 7,135,445 B2
(45) Date of Patent: Nov. 14, 2006

(54) PROCESS FOR THE USE OF BIS-CHOLINE AND TRIS-CHOLINE IN THE CLEANING OF QUARTZ-COATED POLYSILICON AND OTHER MATERIALS

(75) Inventors: Richard William Charm, Brentwood, CA (US); De-Ling Zhou, Sunnyvale, CA (US); Robert J. Small, Tuscon, AZ (US); Shihying Lee, Fremont, CA (US)

(73) Assignee: EKC Technology, Inc., Hayward, CA (US)

( * ) Notice: Subject to any disclaimer, the term of this patent is extended or adjusted under 35 U.S.C. 154(b) by 190 days.

(21) Appl. No.: 10/689,657

(22) Filed: Oct. 22, 2003

(65) Prior Publication Data

US 2004/0147421 A1 Jul. 29, 2004

Related U.S. Application Data

(63) Continuation-in-part of application No. 10/007,134, filed on Dec. 4, 2001.

(51) Int. Cl.
  *C11D 7/50* (2006.01)
(52) U.S. Cl. ........................................ 510/175; 134/1.3
(58) Field of Classification Search .................... None
  See application file for complete search history.

(56) References Cited

U.S. PATENT DOCUMENTS

| | | | |
|---|---|---|---|
| 4,172,005 A | 10/1979 | Muraoka et al. | |
| 4,239,661 A | 12/1980 | Muraoka et al. | |
| 4,294,911 A | 10/1981 | Guild | |
| 4,339,340 A | 7/1982 | Muraoka et al. | |
| 4,395,479 A | 7/1983 | Ward et al. | |
| 4,401,747 A | 8/1983 | Ward, Jr. et al. | |
| 4,403,028 A | 9/1983 | Mustacchi et al. | |
| 4,428,871 A | 1/1984 | Ward et al. | |
| 4,464,461 A | 8/1984 | Guild | |
| 4,617,251 A | 10/1986 | Sizensky | |
| 4,744,834 A | 5/1988 | Haq | |
| 4,770,713 A | 9/1988 | Ward | |
| 4,824,763 A | 4/1989 | Lee | |
| 4,904,571 A | 2/1990 | Miyashita et al. | |
| 5,102,777 A | 4/1992 | Lin et al. | |
| 5,279,791 A | 1/1994 | Aldrich et al. | |
| 5,308,745 A | 5/1994 | Schwartzkopf | |
| 5,334,332 A | 8/1994 | Lee | |
| 5,399,464 A | 3/1995 | Lee | |
| 5,417,802 A | 5/1995 | Obeng | |
| 5,480,585 A | 1/1996 | Shiotsu et al. | |
| 5,635,423 A | 6/1997 | Huang et al. | |
| 5,705,430 A | 1/1998 | Avanino et al. | |
| 5,739,579 A | 4/1998 | Chiang et al. | |
| 5,846,695 A | 12/1998 | Iwata et al. | |
| 5,968,848 A * | 10/1999 | Tanabe et al. | 438/745 |
| 6,060,439 A * | 5/2000 | Doyel et al. | 510/164 |
| 6,235,693 B1 * | 5/2001 | Cheng et al. | 510/175 |
| 6,417,112 B1 * | 7/2002 | Peyne et al. | 438/754 |
| 6,475,966 B1 * | 11/2002 | Sahbari | 510/175 |
| 6,531,436 B1 * | 3/2003 | Sahbari et al. | 510/176 |
| 6,585,825 B1 * | 7/2003 | Skee | 134/3 |
| 6,777,380 B1 * | 8/2004 | Small et al. | 510/176 |
| 6,825,156 B1 * | 11/2004 | Lee et al. | 510/176 |
| 6,916,772 B1 * | 7/2005 | Zhou et al. | 510/201 |
| 2002/0134963 A1 | 9/2002 | Peyne et al. | |

FOREIGN PATENT DOCUMENTS

| | | |
|---|---|---|
| JP | 62-2813232 | 12/1987 |
| JP | 63-208043 | 8/1988 |
| JP | 64-42653 | 1/1989 |
| JP | 64-81949 | 3/1989 |
| JP | 1-191450 | 8/1989 |
| JP | 2-275631 | 11/1990 |
| JP | 3-227009 | 10/1991 |
| JP | 4-124668 | 4/1992 |
| JP | 4-350660 | 12/1992 |
| JP | 5-181753 | 7/1993 |
| JP | 6-41773 | 2/1994 |
| JP | 6-163495 | 6/1994 |
| JP | 8-87118 | 4/1996 |
| JP | 11-197523 | 7/1999 |

* cited by examiner

*Primary Examiner*—Gregory Webb
(74) *Attorney, Agent, or Firm*—Morgan Lewis & Bockius LLP

(57) ABSTRACT

A new cleaning chemistry based on bis-choline and tris-choline compounds, such as their hydroxides, is provided in order to address the removal of photoresist and flux while minimizing any etching of the substrate.

27 Claims, No Drawings

PROCESS FOR THE USE OF BIS-CHOLINE AND TRIS-CHOLINE IN THE CLEANING OF QUARTZ-COATED POLYSILICON AND OTHER MATERIALS

This application is a continuation in part of U.S. application Ser. No. 10/007,134 filed Dec. 4, 2001 pending.

FIELD OF THE INVENTION

The present invention relates to compositions and processes for cleaning, solvating, dissolving, and/or removing debris and residues from substrates. More specifically, it relates to compositions and processes for cleaning polymeric materials and organic, organometallic and metallic oxides from quartzwares. The invention further relates to compositions and methods for cleaning fluxes and resist materials from microcircuits.

BACKGROUND OF THE INVENTION

Cleaning solvents are used throughout industry. These solvents are made from various organic and inorganic materials forming compositions differing in functionality and effectiveness. In order for cleaning solvents to be effective, the cleaning solvent, the material to be removed, and the surrounding material or substrate must be examined to insure that the material or residue to be removed can be dissolved, solvated, or removed by the cleaning solvent without damaging the surrounding materials. Several factors, such as pH, polarity, chemical reactivity, and chemical compatibility must be considered when selecting a cleaning solvent. Other factors must also be considered when utilizing cleaning solvents, such as environmental regulations, safety concerns, and cost.

Choline and other solvents have been utilized for a variety of processes in industry. These choline compositions have been used, for example, in the microprocessor industry, and the automotive industry. In these and other industries, there have been problems associated with the use of choline compounds and choline derivative compounds.

In the microprocessor industry, various materials are utilized throughout a device. Typically, many of the base structures are made of silicon or quartzware (e.g. silicon dioxide). Also present in this industry are metal products such as copper, aluminum, gold, and silver. The process of building these intricate structures is often so small that mechanical means of construction cannot be utilized. A photolithographic process is often used to construct the pattern on the microcircuit. This process utilizes photoresist materials on an insulating film or a conductive metal film (such as an oxide film, a copper film, or aluminum alloy film), coated on a substrate, to create the pattern on the microcircuit. These photoresists are used as masking materials to delineate patterns onto a substrate so that the patterns can be subsequently etched or otherwise defined into the substrate. A spin station is used to apply the photoresist on the surface of the wafer by dispensing the photoresist on the wafer. The spin station includes a member such as a spin chuck for holding and rotating the wafer and a spindle connected to a motor for rotating the spin chuck. The spin station also includes a catch cup and a dispensing member for applying the photoresist to the wafer. During the spin-coating process, the spinning of the chuck quickly rotates the wafer, which spreads the photoresist across the surface of the wafer and rids the excess photoresist off the wafer. The final steps in preparing the substrate then involve removing the unexposed resist material and any etching residue, if etching was used, from the substrate. It is critical that all of the photoresist, flux and other debris and residue be removed to provide a wafer having sufficient integrity for subsequent use of the wafer in microcircuitry.

Additionally, plasma etching, reactive ion etching, or ion milling are also used to define the pattern in a substrate. During such etching processing, an organometallic by-product compound can be formed on the sidewall of the substrate material. A recently developed technique effective for photoresist removal is plasma oxidation, also known as plasma ashing. However, while this process is effective for removing a photoresist, it is not effective for removing the organometallic polymer formed on the sidewall of the substrate during the etching process.

Polyimides are also used in microelectronics as fabrication aids, passivants, and inter-level insulators. The use of a polyimide as a fabrication aid includes application of the polyimide as a photoresist, planarization layer in a multi-level photoresist scheme and as an ion implant mask. In these applications, the polymer is applied to a wafer or substrate, subsequently cured or patterned by a suitable method and removed after use. Many conventional strippers are not sufficiently effective in removing the polyimide layer once the polyimide has been subjected to curing. The removal of such polyimides is normally accomplished by boiling the substrate in hydrazine or in oxygen plasma.

The catch cups of the photolithographic process must also be cleaned. Clean air is directed through the spin station to control the temperature and humidity of the environment in the catch cup. Because the photoresist typically includes a high concentration of volatile solvents, the photoresist will quickly dry and adhere to the inner walls of the catch cup before it can drain from the bottom of the catch cup. The resist will deposit on the inner walls of the top, the bottom, and the shield of the catch cup. After even a few processing cycles, excessive amounts of photoresist can begin to accumulate on the inner walls of the catch cup. This build up of photoresist on the inner walls of the catch cup can alter the desired air flow characteristics around the wafer and can lead to wafer contamination and poor coating uniformity.

Typically, cleaning the catch cups has been by removing the catch cup from the spin station and manually applied cleaning fluids to the contaminated inner surfaces of the catch cup. Another method of cleaning the catch cups involves a system having two rotating catch cups; one of the catch cups actively catches excess photoresist while a cleaning solvent is dispensed on the contaminated walls of the second catch cup. The solvents used in these processes often poses a safety concern, as they may be health or environmental hazards. These hazards increase overall costs of cleaning by increasing materials handling costs and safety equipment costs.

Traditionally, the photoresist material was used to create interconnects made of aluminum or aluminum alloys isolated by dielectric material, for example silicon dioxide. More recently developed interconnects use copper as the conducting material and low-k dielectric material (a dielectric, having a dielectric constant, $\epsilon$, smaller than the dielectric constant of silicon dioxide). To integrate copper and eventually aluminum, the pattern is transferred from the photoresist through the dielectric. The gaps are then filled up by the conducting layer. This process is called damascene and can integrate either one level of interconnect only (single damascene) or both the horizontal interconnects and the vertical interconnects called vias (dual damascene). Vias always open atop the underlying metal lines and good cleanliness of the via is required in order to minimize electrical resistance along the interconnect.

Various processes have been developed to build those structures, as disclosed, for example, in U.S. Pat. Nos. 5,739,579; 5,635,423; 5,705,430; and 5,686,354, which can include optional layers into the dielectric stack but all those processes have in common:

that the via needs to be cleaned from all post etch residues, without damaging the metal, before the second metal layer can be deposited, that the whole dielectric material needs to be cleaned from copper compounds back-sputtered onto the sidewall and top surface on the underlying copper during the final part of the etching, called "opening".

that the transfer of the wafer from the etching chamber to the ambient air for further processing creates oxidized copper compounds CuO or $Cu_2O$ that need to be cleaned to minimize the via resistance.

It has been described previously to clean materials used in the semiconductor industry by including a small amount (generally between 1% and 5% weight) of choline and other compounds to remove or avoid adsorption of metal impurities (U.S. Pat. Nos. 4,239,661 and 4,339,340, and Japanese Patent Nos. 6-163495, 6-041773, 2-275631, and 1-191450). Choline base is also well known for its use as developer of positive working photoresist (U.S. Pat. Nos. 4,294,911 and 4,464,461). It has also been recognized that choline base can act as a etching agent of metal for thin film layer definition (Japanese Patent No. 62-281332 and U.S. Pat. No. 4,172,005) and that adding choline atoms into an etching chamber when etching copper helps to lower the process temperature and hence minimize copper oxidation. U.S. Pat. No. 5,846,695 discloses aqueous solutions of quaternary ammonium hydroxides, including choline, in combination with nucleophilic amines and sugar and/or sugar alcohols, for removal of photoresist and photoresist residues in integrated circuit fabrication.

During the formation and utilization of these wares, excess coatings and/or flux from the manufacturing process can remain on the quartzware. In electronic applications the effectiveness of the production cleaning process can directly affect the reliability of the finished device. For example, a clean surface is necessary to ensure good bonding and coating, chemical contaminants can cause corrosion, and particulate matter may provide conductance paths resulting in current leakage or electrical short circuits. These are usually time related failure mechanisms that occur after the device has been put into use. The removal of these fluxes has posed a lasting difficulty for the microprocessor industry for many reasons, including the presence of various types of materials all having different reactivities and tolerances for chemical solvents. The removal of solder-flux from printed circuit boards is essentially one of washing the board with either an organic-solvent or water based cleaning solution. With the increasing limitations on organic-solvent-systems that are imposed by environmental considerations, the water-based-systems are starting to dominate flux-removal processes. Whichever process is used, it is generally involves a dissolving/dilution/flushing process where the flux is dissolved and dispersed within the flushing-solvent through the action of one or more surface-active agents.

Existing cleaning compositions used in the semiconductor industry are not suitable for the following reasons:

amine containing products are not compatible with copper and dissolve the metal at the exposed areas;

dilute hydrofluoric acid solutions (DHF) remove the sidewall polymer and CuO compounds by aggressively attacking the sidewall of the dielectric and hence change the designed dimensions of the device. Furthermore those solutions are ineffective for cleaning $Cu_2O$ or $CF_x$ compounds.

Optionally the photoresist might or might not be removed before the copper is exposed. Using traditional photoresist removal techniques is not ideal for the following reasons:

an oxygen plasma step will oxidize the copper to the CuO and $Cu_2O$ states, which will increase the via resistance, an oxygen plasma step will be detrimental to organic dielectric material, if used, by etching the material in an uncontrolled manner.

a traditional solvent used to remove photoresist such as, for example, products containing N-methyl pyrrolidone, might require an extra cure step to recover the dielectric constant and properties of an organic dielectric.

Copper has been chosen because it is a relatively inexpensive metal with better conductivity ($\rho=1.7$ $\Omega\cdot$cm) than aluminum ($\rho=2.7$ $\Omega\cdot$cm). However the main drawbacks of this material are first its high diffusivity into silicon, introducing risk of a killing defect in the front end device, and second the difficulty to dry etch it and integrate it in traditional processes. In addition, copper does not form an oxide passivation layer under ambient conditions (as aluminum does), making this metal very difficult to work with.

On the gap-fill side, the industry's choice of low-k dielectric material has not yet emerged, though various candidates have been suggested. It has been shown that a general trend to achieve lower dielectric constant is to use material with less silicon and more carbon. There is then a logical evolution from the inorganic materials (such as $SiO_2$ [$\epsilon=4$], SiOF [$\epsilon=3.5$]) to silsesquioxane types of material (such as HSQ, MSQ [$3.0<\epsilon<3.5$]), towards organic material, such as benzyl cyclobutane (BCB) or silicon low k (SiLK) [$\epsilon=2.7$]), with the ultimate low-k value being reached with air gaps.

We have seen over the past few years, the emergence of the damascene type of structure in which the design is etched into a dielectric layer, which is then filled with conducting wires and planarized. Dual damascene structures have the advantage of incorporating both lines and vias in one deposition step; this reduces the number of process steps and is therefore cost effective. However the main reason for the emergence of such structures nowadays is the fact that this is the easiest way to introduce copper.

Variations of the dual damascene structure exist, incorporating a series of layers for process purposes such as anti-reflective coatings, adhesion promoters, moisture barriers, diffusion barriers, polishing stops, buried etch mask and so on. The choice of whether those have to be used or not and what material ($SiO_xN_y$ or $Si_xN_y$) should be used for them often depend upon the final choice of the low-k material.

Known photoresist stripper compositions containing a combination of a polar solvent and an amine compound include:

1. U.S. Pat. No. 4,403,029 describes alkaline/solvent mixtures useful as photoresist strippers, but not necessarily cleaners, that include dimethylacetamide or dimethylformamide and alkanolamines.

2. U.S. Pat. Nos. 4,428,871, 4,401,747, and 4,395,479 describe cleaners containing 2-pyrrolidone, dialkylsulfone and alkanolamines.

3. U.S. Pat. No. 4,744,834 describes cleaners containing 2-pyrrolidone and tetramethylammonium hydroxide. Such stripping compositions, however, have only proven successful in cleaning "sidewall polymer" from the contact openings and metal line etching in simple microcircuit manufacturing involving a single layer of metal when the metal structure involves mainly Al—Si or Al—Si—Cu and the residue that contains only an organometallic compound with aluminum.

4. U.S. Pat. No. 4,617,251 teaches a positive photoresist stripping composition containing (A) selected amine compound (e.g., 2-(2-aminoethoxy)-ethanol; 2-(2-aminoethylamino)-ethanol; and mixtures thereof) and (B) selected polar solvents (e.g., N-methyl-2-pyrolidinone, tetrahydrofurfuryl alcohol, isophorone, dimethyl sulfoxide, dimethyl adipate, dimethyl glutarate, sulfolane, gamma-butyrolactone, N,N-dimethylacetamide and mixtures thereof). The reference further teaches that water as well as dyes or colorants, wetting agents, surfactants and antifoamers may be added into this composition.

5. U.S. Pat. No. 4,770,713 teaches a positive photoresist stripping composition containing (A) a selected amide (e.g., N,N-dimethyl acetamide; N-methyl acetamide; N,N-diethyl acetamide; N,N-dipropyl acetamide; N,N-dimethyl propionamide; N,N-diethyl butyramide and N-methyl-N-ethyl propionamide) and (B) selected amine compound (e.g., monoethanolamine, monopropanolamine, methyl-aminoethanol). The patent also teaches this stripper may optionally contain a water miscible nonionic detergent (e.g., alkylene oxide condensates, amides and semi-polar nonionics).

6. U.S. Pat. No. 4,824,763 teaches positive-working photoresist stripping composition containing (A) triamine (e.g., diethylene-triamine) and (B) a polar solvent (e.g., N-methyl-2-pyrrolidone, dimethylformamide, butyrolactone, aliphatic hydrocarbons, aromatic hydrocarbons, chlorinated hydrocarbons).

7. U.S. Pat. No. 4,904,571 teaches printed circuit board photoresist stripper composition containing (A) a solvent (e.g., water, alcohols, ethers, ketones, chlorinated hydrocarbons and aromatic hydrocarbons); (B) an alkaline compound dissolved in said solvent (e.g., primary amines, secondary amines, tertiary amines, cyclic amines, polyamines, quaternary ammonium amines, sulfoniumhydroxides, alkali hydroxides, alkali carbonates, alkali phosphates and alkali pyrophosphates); and (C) a borohydride compound dissolved in said solvent (e.g., sodium borohydride, lithium borohydride, dimethyl amine borone, trimethyl amine borone, pyridane borone, tert-butyl amine borone, triethyl amine borone, and morpholine borone).

8. U.S. Pat. No. 5,102,777 teaches a positive photoresist stripper composition comprising (A) a solvent (e.g., a pyrrolidone compound, a diethylene glycol monoalkyl ether, a sulfur oxide compound, a sulfolane compound or a mixture thereof); (B) an amine (e.g., alkanolamine); and (C) a fatty acid (e.g., capric acid, lauric acid, talmitric acid, caprylic acid, myristic acid, oleic acid, stearic acid, linoleic acid, linolic acid, buthylic acid, abietic acid, isooctoic acid, isohexadecanoic acid, isostearic acid, behenic acid, undecylenic acid, hydroxystearic acid, chipanodonic acid, arachidonic acid, oleostearic acid, and 2-ethylhexadecanilic acid).

9. U.S. Pat. No. 5,279,791 teaches a stripping composition for removing resists from substrates containing (A) hydroxylamine; (B) at least one alkanolamine; and optionally (C) at least one polar solvent.

10. U.S. Pat. No. 5,308,745 teaches an alkaline-containing photoresist stripping composition comprising (A) a stripping solvent (e.g., 2-pyrrolidinone, 1-methyl-2-pyrrolidinone, 1-ethyl-2-pyrrolidinone, 1-propyl-2-pyrrolidinone, 1-hydroxyethyl-2-pyrolidinone, 1-hydroxypropyl-2-pyrrolidinone, diethylene glycol monoalkyl ethers, dialkyl sulfones, dimethyl sulfoxide, tetrahydrothiophene-1,1-dioxides, polyethylene glycol, dimethylacetamide and dimethylformamide; (B) a nucleophilic amine (e.g., 1-amino-2-propanol, 2-(2-aminoethoxy) ethanol, 2-aminoethanol, 2-(2-aminoethylamino)-ethanol and 2-(2-aminoethylamino) ethylamine); and (C) a non-nitrogen containing weak acid (e.g., acetic acid, phthalic acid, 2-mercaptobenzoic acid, 2-mercaptoethanol, 1,3,5-trihydroxybenzene, pyrogallol, resorcinol, 4-tert-butylcatechol, carbonic acid and hydrofluoric acid).

11. U.S. Pat. No. 5,334,332 teaches a photoresist resist stripping and cleaning composition comprising (A) hydroxylamine; (B) at least one alkanolamine; (C) water; (D) optionally, at least one polar solvent; and (E) optionally, a chelating reagent (e.g., thiophenol, ethylenediamine tetraacetic acid and 1,2-dihydroxybenzene) to reduce the surface metal contamination on wafers.

12. U.S. Pat. No. 5,399,464 teaches a stripping composition for removing positive organic photoresist from a substrate comprising (A) a triamine (e.g., diethylene triamine); (B) a nonpolar or polar organic solvent (e.g., N-methyl pyrrolidone).

13. U.S. Pat. No. 5,417,802 teaches a material useful for photoresist removal or post-metal etch clean up that comprises (A) primary or secondary amines; (B) solvents (e.g., dimethyl sulphoxide or dimethylacetylamide); and (C) organic ligands such as crown ethers or cyclodextrines).

14. Japanese Published Patent Application No. 63-208043, which was published to R. Ohtani (Kanto Chemical) on Aug. 29, 1988, teaches a positive-working photoresist stripper composition containing (A) 1,3-dimethyl-2-imidazolidinone; (B) a water-soluble organic amine [e.g., monoethanolamine, 2-(2-aminoethoxy)-ethanol, triethylene(tetramine)]. The application also teaches a surfactant may be added to the stripper.

15. Japanese Published Patent Application No. 64-081949, which was published to K. Matsumoto (Asahi Chemical) on Mar. 28, 1989, teaches a positive-working photoresist stripper composition containing (A) a solvent (e.g., gamma-butyrolactone, N-methyl-formamide, N,N-dimethylformamide, N,N-dimethyl-acetamide or N-methylpyrrolidone); (B) an amino alcohol (e.g., N-butyl-ethanolamine and N-ethyldiethanolamine); and (C) water.

16. Japanese Published Patent Application No. 4-350660, which was published to H. Goto (Texas Instruments, Japan and Kanto Chemical, Inc.) on Dec. 4, 1992, teaches a stripper for positive photoresists comprising (A) 1,3-dimethyl-2-imidazolidinone (DMI), (B) dimethylsulfoxide (DMSO) and (C) a water-soluble amine [e.g., monoethanolamine or 2-(2-amino-ethoxy)ethanol] wherein the amount of the water-soluble amine is 7–30% by weight.

17. Japanese Published Patent Application No. 1999-197523 describes a stripper composition for photoresist used in manufacture of liquid crystal display device that includes 5–15 weight % of alkanolamine, 35–55% sulfoxide or sulfone compound, and 35–55 wt. % glycol ether.

18. Japanese Published Patent Application No. 08087118 describes a stripper composition that includes 50–90 weight % of alkanolamine, and 50–10% dimethyl sulfoxide or N-methyl-2-pyrrolidone.

19. Japanese Published Patent Application No. 03227009 describes a stripper composition that includes ethanolamine and dimethyl sulfoxide.

20. Japanese Patent 07069619 describes a stripper composition that includes alkanolamine, dimethyl sulfoxide, and water.

21. U.S. Pat. No. 5,480,585 and the Japanese Patent Hei. 5-181753 disclose organic strippers comprising alkanolamine, sulfone compound or sulfoxide compound and a hydroxyl compound.

22. The Japanese Laid-open Patent 4-124668 discloses a photoresist stripping composition including an organic amine of 20–90% by weight, phosphoric ester surfactant of 0.1–20% by weight, 2-butyne-1,4-diol of 0.1–20% by weight, and the remainder glycolmonoalkylether and/or aprotic polar solvent.

23. The Japanese Patent Laid-open Sho. 64-42653 discloses a photoresist stripping composition comprising over 50% by weight of dimethylsulfoxide (more desirably over 70% by weight), 1 to 50% by weight of a solvent selected among diethyleneglycolmonoalkylether, diethyleneglycoldialkylether, gamma-butyrolactone and 1,3-dimethyl-2-imidazoledione, and 0.1–5% by weight of nitrogen-including organic hydroxyl compound such as monoethanolamine. It states that the amount of dimethylsulfoxide less than 50% by weight causes great reduction in stripping force, while the amount of nitrogen-including organic hydroxyl compound solvent over 5% by weight corrodes the metal film such as aluminum.

Depending on the constituents of the compositions and the ratio thereof, the aforementioned stripping compositions exhibit greatly different characteristics in photoresist stripping force, metal corrosion properties, the complexities of a rinsing process following the stripping, environmental safety, workability and price. Several commercial products are now available to clean the photoresist and plasma etching residues left by plasma etching followed by oxygen ashing. For example, EKC 265™, available from EKC Technology, Inc., is a plasma etching cleaning solution composed of water, alkanolamine, catechol and hydroxylamine. Such a composition is disclosed in U.S. Pat. No. 5,279,771 to Lee.

Although these commercial products can dissolve photoresist and plasma-etching residues, the combination of water and alkanolamine contained therein can also attack the metallic layers deposited patternwise on the substrate. The addition of a corrosion inhibitor to these products can mitigate the unwanted attack on the metallic layers and oxide layers deposited on the substrate. However, even in the presence of a corrosion inhibitor, they may attack certain corrosion-sensitive metal layers such as copper, aluminum or aluminum alloys (e.g., Al—Cu—Si), titanium nitride, titanium tungsten and the like.

It is difficult to balance effective plasma etching residue removal and corrosion inhibition because chemical compositions of the plasma etching residues are generally similar to those of the metal layers or oxide layers on the substrate. The alkanolamine used in the prior art cleaning compositions was often times found to attack both the plasma etching residues and the substrate metal layers in the presence of water. Water is often added as a contaminant, for example from the atmosphere, from wet components, and the like, and may even be released from certain photoresist structures during dissolution. The problem of water-cleaning composition induced corrosion has resulted in manufacturers resorting to alcohol or other solvent, for example isopropyl alcohol, to remove the cleaner.

Moreover, if a post-cleaner rinse such as isopropyl alcohol was not used, the corrosion could be very severe. In addition, some types of the corrosion inhibitors have been found to retard plasma etching residue removal and other treatments. There is a need for strippers that are useful with corrosion-prone metal substrates, particularly for copper substrates, which do not corrode metal substrates in the presence of small quantities of water.

The stripping and cleaning compositions of the present invention remove photoresists without attacking the substrates themselves include metal substrates such as copper, aluminum, titanium/tungsten, aluminum/silicon, aluminum/silicon/copper; and substrates such as silicon oxide, silicon nitride, and gallium/arsenide, and plastic substrates such as polycarbonate. The requirement for a cleaning solution to remove all types of residue generated as a result of resist and etching of various types of metals, such as aluminum, aluminum/silicon/copper, titanium, titanium nitride, titanium/tungsten, tungsten, silicon oxide, polysilicon crystal, etc., presents a need for more effective cleaning chemistry in the processing area.

In addition to removing completely the resist material, particularly with the introduction of submicron process techniques to form wafers, there is a demand for cleaning technology for removing etching residue remaining following resist removal. Unfortunately, it has been found that no one cleaner is universal, in that it can clean the required materials without adversely affecting or hindering subsequent manufacturing operation or process steps involving the substrate. The requirement for a cleaning solution to remove photoresist and other residue of various types of metals, such as aluminum, aluminum/silicon/copper, titanium, titanium nitride, titanium/tungsten, tungsten, silicon oxide, polysilicon crystal, low-k materials, etc., presents a need for more effective cleaning chemistry in the processing area.

SUMMARY OF THE INVENTION

A cleaning or photoresist stripping composition including: (a) a polar aprotic organic solvent, preferably a cyclic nitrogen-containing compound, more preferably an N-alkyl-2-pyrrolidone (e.g., N-methyl-2-pyrolid(in)one), in an amount ranging from about 5 parts to about 50 parts, preferably from about 15 parts to about 35 parts, more preferably from about 20 parts to about 30 parts by weight, for example between about 24 parts and 26 parts; (b) a bis-choline and/or tris-choline salt in an amount ranging from about 0.2 parts to about 20 parts, preferably from about 0.5 parts to about 10 parts, more preferably between about 1 part and about 5 parts by weight, for example between about 2 parts and about 4 parts; and (c) a sulfoxide, preferably an alkylsulfoxide, more preferably comprising dimethyl sulfoxide, methyl sulfoxide, or a mixture thereof, in an amount ranging from about 50 parts to about 94 parts, more preferably from about 60 parts to about 84 parts, more preferably between about 66 parts to about 76 parts by weight, for example between about 70 parts and about 72 parts.

In one embodiment, the composition is substantially free of water. In another embodiment, the composition contains up to about 8 parts by weight of water.

In still another embodiment, the composition is substantially free of one or more of the following: additional amines, additional corrosion inhibitors, additional chelating agents, additional surfactants, additional organic solvents, additional acids, and additional bases. In yet another embodiment, the composition is substantially free of all of the following: additional amines, additional corrosion inhibitors, additional chelating agents, additional surfactants, additional organic solvents, additional acids, and additional bases.

In a further embodiment, the composition consists essentially of the three elements (a), (b), and (c) above.

DETAILED DESCRIPTION OF THE INVENTION

In the manufacture of microcircuits, positive photoresists are used as an intermediate mask for transferring an original mask pattern of a reticle onto wafer substrates by means of a series of photolithography and plasma etching steps. One of the steps in the microcircuit manufacturing process is the removal of the patterned photoresist films from substrates. One method involves a wet stripping step in which the photoresist-covered substrate is brought into contact with a photoresist stripper solution.

As integrated circuit manufacturing has become more complex and the dimensions of circuit elements fabricated on silicon or other semiconductor wafers have become smaller, continued improvement in techniques used to remove photoresist or other polymeric materials and residues formed from such materials has been required. Photoresist or other polymeric materials, such as polyimide, are often subjected to ion implantation, plasma etching, reactive ion etching or ion milling during the fabrication processes to define patterns in the substrate. Additionally, oxygen plasma oxidation is often used for removal of photoresist or other polymeric materials after their use during the fabrication process has been completed. Such high energy processes typically result in the hardening of the photoresist and the formation of organometallic and other residues on sidewalls of the structures being formed in the fabrication process.

A variety of metal and other layers are commonly employed in integrated circuit fabrication, including aluminum, aluminum/silicon/copper, titanium, titanium nitride, titanium/tungsten, tungsten, silicon oxide, polysilicon crystal, and the like. The use of such different layers results in the formation of different organometallic residues in the high energy processes. In addition to being effective for removing photoresist or other polymeric materials or residues, stripping and cleaning compositions should also not attack the different metallurgies used in integrated circuit fabrication. Generally, a photoresist stripping composition should have a high photoresist dissolving and stripping force, and should maintain a stripping force for various kinds of substrates. The composition should have good chemical properties, such as stripping force, non-corrosiveness of metal and safety of humans, and prevent photoresist residues or impurities from remaining on the substrate.

The method of cleaning a substrate using the cleaning compositions of the present invention involves contacting a substrate having residues and/or flux thereon with a cleaning composition of the present invention for a time and at a temperature sufficient to remove the residue. Stirring, agitation, circulation, sonication or other techniques as are known in the art optionally may be used. The substrate is generally immersed in the cleaning composition. The time and temperature are determined based on the particular material being removed from a substrate. Generally, the temperature is in the range of from about 10° C., to about 100° C., preferably from 15° C. to about 75° C., most preferably from about 20° C. to about 55° C. The contact time is from about 1 to about 60 minutes, preferably about 5 to about 30 minutes. Generally the substrate will be rinsed after using the composition. While the rinse composition may vary based on the cleaning composition and on the substrate, inter alia, preferred rinse solutions include isopropanol and/or deionized water.

The compositions of the invention are particularly useful for removing residue and flux from metals and via features but are also useful for stripping photoresists. The application of the present compositions as a photoresist stripper is easily determined by one of skill in the art.

The present invention provides the photoresist stripping composition that meets above-described conditions by increasing the amounts of a polar solvent and an amine compound. The photoresist stripping composition includes a choline compound, a solvent, and optional stabilizers, chelators, and the like.

In another embodiment, the invention also relates to a non-corrosive stripper useful for many combinations of metals and dielectric compounds. The formulations are especially useful on copper (e.g., PVD or electroplate) and low-k dielectrics (e.g., Coral), also on aluminum, TEOS, solder bumps, and the like. The composition is particularly useful with copper substrates, as it does not encourage copper corrosion.

In yet another embodiment, the invention also relates generally to manufacture of semiconductor devices incorporating a metal interconnect. More specifically, it relates to a composition and process to clean post etch residues at an interconnect level, such as with a copper metallurgy, preferably incorporating a damascene/dual damascene structure. The invention further relates to a composition for other post etch residue-cleaning applications, such as aluminum, or aluminum alloy interconnects with misaligned tungsten plugs.

A key challenge in reduced geometry devices, such as in 0.18 μm technology, is the interconnect RC delay time, which becomes the limiting factor of the device performance. This delay can be improved by combining low dielectric constant between tracks and the use of copper as a better conductor. This application is directed to solving some of the difficulties in integrating this type of interconnects, and a new strategy for the post dielectric etch cleaning process. The development of new cleaning chemistries and processes for their use, which are compatible with copper and low-k dielectric materials, is essential for process integration.

Since copper can not easily be dry etched, the use of damascene or dual damascene structures is becoming a key solution to realize this integration. With the appearance of new materials such as organic polymers for inter metal dielectric material, and the need to etch complex layers of dielectric materials, photoresist removal and cleaning steps can benefit from a new strategic approach.

In each embodiment, the composition includes an amount of a bis-choline compound, a tris-choline compound, or a combination thereof, and a solvent. Further, each of these compositions may include several optional ingredients. The choline compositions of the present invention contain from about 1 to about 70 weight %, preferably about 5 to about 50 weight %, most preferably about 10 to about 30 weight %, of the choline compound.

In the compositions and processes of this invention, the choline compounds can be bis-choline compounds (bis-(2-hydroxy-ethyl)-dimethyl-ammonium ion); tris-choline (tris-(2-hydroxy-ethyl)-methyl-ammonium ion) compounds; or a combination thereof.

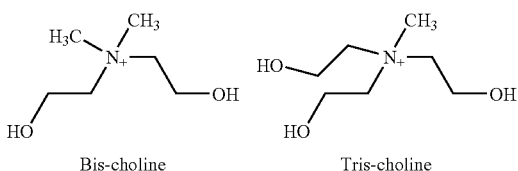

Bis-choline    Tris-choline

In the compositions and processes of this invention, the choline compound can be in the hydroxide or salt form, including, but not limited to, tris-choline hydroxide, bis-choline hydroxide, tris-choline bicarbonate, bis-choline bicarbonate, tris-choline chloride, or bis-choline chloride. Preferably, the choline compound is bis-choline hydroxide and/or tris-choline hydroxide.

The formation of the choline compounds can be by any production method known to one of ordinary skill in the art. Typical methods include reacting trimethylamine and ethylene chlorohydrin or ethylene oxide as taught by U.S. Pat. No. 2,774,759, the entire contents of which is hereby expressly incorporated by reference.

The use of bis-choline or tris-choline is advantageously used in the compounds of this invention. Without wishing to be bound by theory, it is believed that bis-choline compounds show reduced efficacy in etching quartzwares while tris-choline compounds do not substantially etch quartzwares because of the addition of hydroxyethyl groups to the central nitrogen. It is believed that this addition sterically hinders the molecule, making it increasingly less reactive as these groups are added without substantially affecting its solvent properties. An additional effect of this addition is the decrease of the characteristic amine or ammonia smell via the use of bis-choline and tris-choline, resulting in potentially increasable exposure times to humans. Further, the bis-and/or tris-choline compounds leave less residual residue than solvents such as ethyl lactate.

The solvents used in the compositions and for practice of the processes should have a good solubility for cross-linked resist films, flux materials, and other debris that may be present. The solvent is necessary to efficiently remove these materials which are strongly adhering to the substrate. At the same time, the composition should not promote corrosion of the substrate. The composition is useful for most metal-dielectric combinations, including one or more of copper, aluminum, tungsten, titanium, chromium, or the like for metals; and one or more of HSQ, SiLK™, SiOC, Nanoglass™, HOSP™, Coral™, GaAs, TEOS, or the like for low-K materials. The claimed composition is particularly useful on copper, and also on aluminum, TEOS, solder bumps, and the like. Because of its inability to create a passivation layer, traditional cleaning solvents are not well suited to work with copper, as they usually contain aggressive complexing agents.

Suitable organic solvents in the compositions and for practice of the processes can include any solvent known to one skilled in the art. Preferably, the compositions include polar solvents having a dipole moment more than about 3.5, a boiling point of more than about 130° C., or a combination thereof. Exemplary polar solvents of this invention include, but are not limited to, dimethyl sulfoxide, ethylene glycol, ethylene glycol alkyl ether, diethylene glycol alkyl ether, triethylene glycol alkyl ether, propylene glycol, propylene glycol alkyl ether, N-substituted pyrrolidone, ethylene diamine, and ethylene triamine. Preferred solvents for this invention include nitrogen-containing compounds. Preferred nitrogen-containing compounds of the invention are cyclic and include, but are not limited to, N-alkyl-2-pyrolidones (e.g., N-methyl-2-pyrolid(in)one, N-hydroxyethyl-2-pyrrolidone, or a mixture thereof). Preferably, the solvent is N-methylpyrrolidone.

N-methylpyrrolidone is a strong solvent for dissolving the photoresist. The amount of the N-methylpyrrolidone is preferably about 30 to about 50 weight %, and more preferably about 35 to about 45 weight %, based on the total amount of the stripping composition. By using the N-methylpyrrolidone, which is a polar molecule and has high photoresist dissolving power, the stripping force of the composition is not reduced even when the stripping processes are repeated. In one embodiment, the cyclic nitrogen-containing solvents are present in an amount ranging from about 5% to about 50%, preferably from about 15% to about 35%, more preferably from about 20% to about 30% by weight, and most preferably from about 20% to about 28%.

Other additional performance chemicals, for example, surfactants, chelating agents, corrosion inhibitors, and the like, can be added. Preferably the total concentration of these performance chemicals is below about 20% by weight, more preferably below about 10% by weight. In one embodiment, the composition is substantially free from one or more of: additional surfactants, additional chelating agents, and additional corrosion inhibitors.

An optional component of this invention is an additional amine. Suitable additional amine compounds include, but are not limited to, the following and mixtures thereof: hydroxylamine, hydrazine, 2-amino-2-ethoxy ethanol (DGA), monoethanolamine (MEA), diethylhydroxylamine, 2-methylamine ethanol, monomethylethanolamine, cholines, tetramethylammonium formate (TMAF), monoisopropanolamine (MIPA), diethanolamine (DEA), triethanolamine (TEA), di(ethylene) triamine, tri(ethylene) tetramine, tetramethylammonium hydroxide (TMAH), tetrabutyl ammonium hydroxide (TBAH), their salts, and the like. Exemplary compounds include monoethanolamine, 2-(2-aminoethoxy)ethanol, diethanolamine, triethanolamine, and 2-(2-aminoethylamino)ethanol, or any combination thereof. In one embodiment, when present, the amine, preferably an alkanolamine such as monomethylethanolamine (2-methylamino-ethanol), can appear in an amount ranging from about 0.2% to about 20%, preferably from about 0.5% to about 10%, more preferably between about 2% and about 5% by weight. If the amount of alknolamine is less than 0.2 weight %, the stripping force of the composition can sometimes become reduced, and in these cases, impurities can be left over on the substrate. If used in an amount more than 20% by weight, an alkanolamine can degrade the composition's characteristic of being absorbed into the layers, which can increase the contact angle of the composition with the layers and may reduce the photoresist's stripping capabilities. In an alternate embodiment, the composition can be substantially free from additional amines.

Another optional component of the invention includes additional sulfoxide and/or sulfone solvents. Suitable sulfoxide solvents can include one or more of the following: dimethyl sulfoxide (DMSO), methyl sulfoxide, dipropylsulfoxide, diethylsulfoxide, methylethylsulfoxide, diphenylsulfoxide, methylphenylsulfoxide, diethylsulfone, dimethylsulfone, 1,1'-dihydroxyphenyl sulfoxide, a sulfoxide having the formula

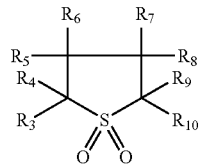

where $R_3$–$R_{10}$ are independently H or an alkyl group, or the like, or a mixture thereof. In one embodiment, the sulfoxide or sulfone, preferably an alkylsulfoxide, more preferably dimethyl sulfoxide, methyl sulfoxide, or a mixture thereof, can be present in an amount ranging from about 50% to about 94%, more preferably from about 60% to about 84%, more preferably between about 66% to about 76% by weight. Without wishing to be bound by theroy, it is believed that the sulfoxide or sulfone controls the surface tension between the surface of the photoresist and the stripping composition. The amount of the sulfoxide or sulfone is preferably about 10 to about 35 weight %, and more preferably about 15 to about 30 weight %, based on the total amount of the stripping composition. In an alternate embodiment, the composition can be substantially free from additional sulfoxide and/or sulfone solvents.

Optionally, a corrosion inhibitor may be included in a formulation used to clean structures with exposed copper present. If present, the corrosion inhibitor is typically provided in an amount from about 0.1 to about 10 weight %, alternately from about 0.5 to about 5 weight %. The corrosion inhibitors are present to protect copper from being corroded, and may be chosen from a variety of classes of chemical compounds, including any compounds used for the prevention of copper corrosion in other systems comprising the art.

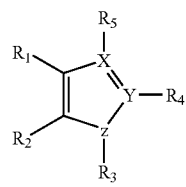

More specifically, compounds of the above-pictured general class may be employed, where X, Y, and Z are chosen from C, N, O, S, and P. Under these conditions the valence requirements and presence of pendant R groups may be set appropriately. Pendant R groups $R_1$–$R_5$ may be chosen independently as H, optionally a substituted $C_1$–$C_6$ straight, branched or cyclo alkyl, alkenyl or alkynyl group, straight or branched alkoxy group, optionally a substituted acyl group, straight or branched alkoxy group, amidyl group, hydroxyl group, a halogen, carboxyl group, alkoxyalkyl group, alkylamino group, alkylsulfonyl group or sulfonic acid group; or the salt of such compounds. In a preferred embodiment X, Y and Z are nitrogen, nitrogen and carbon, respectively, and $R_1$–$R_5$ are hydrogen. In another preferred embodiment, X, Y and Z are nitrogen, $R_3$ is hydrogen and $R_4$ and $R_5$ constitute a benzene ring.

Another class of copper corrosion inhibitors, the hydroxybenzenes, may be employed in the invention independently or in conjunction with the classes already cited herein. These comprise the general class having the following formula:

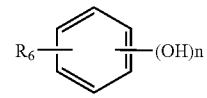

wherein n=1–4, and wherein $R_6$ may be present from 1–5 times and may be chosen independently as H, optionally a substituted $C_1$–$C_6$ straight, branched or cyclo alkyl, alkenyl or alkynyl group, straight or branched alkoxy group, optionally a substituted acyl group, straight or branched alkoxy group, amidyl group, a halogen, carboxyl group, alkoxyalkyl group, alkylamino group, alkylsulfonyl group or sulfonic acid group, or the salt of such compounds. Suitable specific examples of such corrosion inhibitors include catechol, t-butyl catechol, and the like, and combinations thereof.

Another class of copper corrosion inhibitors includes inorganic salts and other corrosion inhibitors. Suitable inorganic salts include, but are not limited to nitrate salts such as ammonium, potassium, sodium and rubidium nitrate salts, aluminum nitrate and zinc nitrate. Other suitable corrosion inhibitors include, but are not limited to, benzotriazole, pyrogallol, gallic acid, and combinations thereof.

The composition can optionally contain hydroxylamine or a hydroxylamine salt, such as a nitrate, phosphate, sulfate, carbonate, or the like. If present, the composition desirably contains from about 0.2 to about 12% by weight of the hydroxylamine or hydroxylamine salt.

Additionally, chelating agents and/or surfactants may be added to the compositions of this invention. Suitable chelating agents are described in commonly assigned U.S. Pat. No. 5,672,577, issued Sep. 30, 1997 to Lee, which is incorporated herein by reference. The addition of a chelator further improves the effectiveness of the formulation used as a etch residue or photoresist remover. If present, the composition desirably contains from about 0.2 to about 12% by weight of the chelating agent.

Suitable surfactants include poly(vinyl alcohol), poly(ethyleneimine) and any of the surfactant compositions classified as anionic, cationic, nonionic, amphoteric, and silicone based. Preferred surfactants are poly(vinyl alcohol) and poly(ethyleneimine). If present, the composition desirably contains from about 0.01 to about 5 weight % of the surfactant.

Some combinations of components require the addition of acids and/or bases to adjust the pH to an acceptable value. The acids suitable for use in the present invention are organic or inorganic. The acids can include nitric, sulfuric, phosphoric, hydrochloric acids (though hydrochloric acid can be corrosive to metals) and the organic acids, formic, acetic, propionic, n-butyric, isobutyric, benzoic, ascorbic, gluconic, malic, malonic, glycolic, oxalic, succinic, tartaric, citric, and gallic.

The caustic components suitable for use to adjust the pH of the cleaning solution can be composed of any common base, e.g., sodium, potassium, magnesium hydroxides, or the like. The major problem is that these bases introduce mobile ions into the final formulation. Mobile ions could destroy computer chips being produced today in the semiconductor industry. Other bases can be used that include ammonium hydroxide or derivatives thereof including trimethyl-2-hydroxyethyl ammonium (choline) hydroxide, and the like.

In one embodiment, the composition can be substantially free from additional acids. In another embodiment, the composition can be substantially free from additional bases. In still another embodiment, the composition can be substantially free from both additional acids and additional bases.

The composition can preferably be water-free, but in some embodiments may contain some water, preferably less than about 10%, more preferably less than about 5%, more preferably less than about 1%.

In a preferred embodiment, the stripper/cleaner composition contains the following:

(a) a polar aprotic organic solvent, preferably a cyclic nitrogen-containing compound, more preferably an N-alkyl-2-pyrrolidone (e.g., N-methyl-2-pyrolid(in)one), in an amount ranging from about 5% to about 50%, preferably from about 15% to about 35%, more preferably from about 20% to about 30% by weight, for example between about 24% and 26%;

(b) a bis-choline and/or tris-choline salt in an amount ranging from about 0.2% to about 20%, preferably from about 0.5% to about 10%, more preferably between about 1% and about 5% by weight, for example between about 1% and about 3%; and (c) a sulfoxide, preferably an alkylsulfoxide, more preferably comprising dimethyl sulfoxide, methyl sulfoxide, or a mixture thereof, in an amount ranging from about 50% to about 94%, more preferably from about 60% to about 84%, more preferably between about 66% to about 76% by weight, for example between about 70% and about 72%.

In another embodiment, the stripper/cleaner composition consists essentially of the following three components:

(a) a polar aprotic organic solvent having a dipole moment of more than 3.5, preferably a cyclic nitrogen-containing compound, more preferably an N-alkyl-2-pyrrolidone (e.g., N-methyl-2-pyrrolid(in)one), in an amount ranging from about 5% to about 50%, preferably from about 15% to about 35%, more preferably from about 20% to about 30% by weight, for example between about 24% and 26%;

(b) bis-choline and/or tris-choline in an amount ranging from about 0.2% to about 20%, preferably from about 0.5% to about 10%, more preferably between about 1% and about 5% by weight, for example between about 1% and about 3%; and (c) a sulfoxide, preferably an alkylsulfoxide, more preferably comprising dimethyl sulfoxide, methyl sulfoxide, or a mixture thereof, in an amount ranging from about 50% to about 94%, more preferably from about 60% to about 84%, more preferably between about 66% to about 76% by weight, for example between about 70% and about 72%.

EXAMPLES

The following examples are meant to summarize, but not to limit, the chemical compositions that can be used in cleaning quartzware, as well as for stripping photoresist from printed circuit boards and wafers, for the purpose of demonstrating the invention.

Example 1

Compositions Using Choline Derivatives as a Stripper for Photoresist on Wafers

| EKC Choline Green | choline derivative | alkanolamine | water | corrosion inhibitors |
|---|---|---|---|---|
| weight % one or more of the components: | 1–25 bis-choline tris-choline | 0.1–10 monoethanolamine (MEA) 2-methylamine ethanol diglycol amine (DGA) di(ethylene) triamine tri(ethylene) tetramine | balance | 0–5 catechol t-butyl catechol pyrogallol gallic acid benzotriazole |
| | | conditions | | |
| | time (min): | temp (C.): | pH: | pressure: |
| optional component(s) | 35–85 | 55 surfactant to wet and/or surfactant to foam | >11 | atmospheric |

Example 1 is a composition that can be used for applying choline derivatives as a stripper for a liquid photoresist on wafers.

Example 2

Compositions Using Choline Derivatives as a Stripper for Dry Film Photoresist on Printed Circuit Boards

| EKC Choline Green | choline derivative | alkanolamine options | water | corrosion inhibitors |
|---|---|---|---|---|
| weight % one or more of the components: | 1–25 bis-choline tris-choline | 0.1–10 monoethanolamine (MEA) 2-methylamine ethanol diglycol amine (DGA) di(ethylene) triamine | balance | 0–5 catechol t-butyl catechol pyrogallol gallic acid |

-continued

|  | tri(ethylene) tetramine |  | benzotriazole |  |
| --- | --- | --- | --- | --- |
|  | conditions | | | |
|  | time (hrs): | temp (C.): | pH: | pressure: |
| step 1 | 4 | 50° C. | >11 | atmospheric |
| step 2 | 65 | room temp | >11 | atmospheric |
| optional component(s) | surfactant to wet and/or surfactant to foam | | | |

Example 2 is a composition that can be used for applying choline derivatives as a stripper for a dry film photoresist on a printed circuit board.

Example 3

Compositions Using Choline Derivatives as a Developer of a Photoresist Film

| EKC Choline Green | choline derivative | alkanolamine | water | corrosion inhibitors |
| --- | --- | --- | --- | --- |
| weight % one or more of the components: | 1–25 bis-choline tris-choline | 0.1–10 monoethanolamine (MEA) 2-methylamine ethanol diglycol amine (DGA) di(ethylene) triamine tri(ethylene) tetramine | balance | 0–5 catechol t-butyl catechol pyrogallol gallic acid benzotriazole |
|  | conditions | | | |
|  | time (min): | temp (C.): | pH: | pressure: |
| optional component(s) | surfactant to wet and/or surfactant to foam | | | |

Example 3 is a composition that can be used for applying choline derivatives as a developer of a photoresist film.

Example 4

An Alternate Composition Using Choline Derivatives as a Stripper for a Dry Film Photoresist on Printed Circuit Boards

|  | Formulation, Wt. % (mmol/100 g) | |
| --- | --- | --- |
| Ingredient | 062B | 062C |
| H$_2$O | 93.3 | 92.9 |
| bis-choline hydroxide (65 wt %; with stabilizer) | 1.7 (~7.3) | |
| tris-choline hydroxide (65 wt. %; with stabilizer) | | 2.1 (~7.5) |
| monoethanolamine (MEA) | 5 (~820) | 5 (~820) |

Example 4 is a composition that can be used for applying choline derivatives as a copper-compatible stripper for a dry film photoresist.

Example 5

A Preferred Composition that can be Used as a Cleaner for Quartzware or Alternately as a Stripper/Remover for Photoresists on Circuit Boards

|  | choline derivative | nitrogen-containing solvents | sulfur-containing solvents |
| --- | --- | --- | --- |
| weight % one or more of the components: | 1–5 bis-choline tris-choline | 20–30 N-methylpyrrolidone N-hydroxyethyl-2-pyrrolidone | 65–75 dimethylsulfoxide methylsulfoxide dimethylsulfone diethylsulfone |
| optional component(s) | water, additional amines, additional corrosion inhibitors, additional chelating agents, additional surfactants, additional organic solvents, additional acids, and/or additional bases | | |

It should further be apparent to those skilled in the art that various changes in form and details of the invention as shown and described may be made without de%ing from the scope of the invention, as set forth in the claims.

What is claimed is:

1. A cleaning or photoresist stripping composition comprising:
   (a) from about 5% to about 50% by weight of a polar aprotic nitrogen-containing solvent having a dipole moment of more than about 3.5;
   (b) from about 0.2% to about 20% by weight of a compound selected from the group consisting of a hydroxide and/or salt of bis-(2-hydroxy-ethyl)-dimethyl ammonium, a hydroxide and/or salt of tris-(2-hydroxy-ethyl)-methyl ammonium, and a mixture thereof; and (c) from about 50% to about 94% by weight of a sulfur-containing solvent selected from the group consisting of a sulfoxide, a sulfone, and a mixture thereof, wherein the composition is substantially free of hydroxylamine.

2. The composition of claim 1, wherein the polar aprotic nitrogen-containing solvent comprises N methyl 2 pyrrolidone.

3. The composition of claim 1, wherein the polar aprotic nitrogen-containing solvent is present in an amount from about 15% to about 35% by weight.

4. The composition of claim 3, wherein the polar aprotic nitrogen-containing solvent is present in an amount from about 20% to about 30% by weight.

5. The composition of claim 4, wherein the polar aprotic nitrogen-containing solvent is present in an amount from about 24% to about 26% by weight.

6. The composition of claim 1, wherein the hydroxide and/or salt of bis-(2-hydroxy-ethyl)-dimethyl ammonium, a hydroxide and/or salt of tris-(2-hydroxy-ethyl)-methyl ammonium, or mixture thereof is present in an amount from about 0.5% to about 10% by weight.

7. The composition of claim 6, wherein the hydroxide and/or salt of bis-(2-hydroxy-ethyl)-dimethyl ammonium, a hydroxide and/or salt of tris-(2-hydroxy-ethyl)-methyl ammonium, or mixture thereof is present in an amount from about 1% to about 5% by weight.

8. The composition of claim 7, wherein the hydroxide and/or salt of bis-(2-hydroxy-ethyl)-dimethyl ammonium, a hydroxide and/or salt of tris-(2-hydroxy-ethyl)-methyl ammonium, or mixture thereof is present in an amount from about 1% to about 3% by weight.

9. The composition of claim 1, wherein the sulfur-containing solvent comprises dimethyl sulfoxide, methyl sulfoxide, or a mixture thereof.

10. The composition of claim 9, wherein the sulfur-containing solvent is present in an amount from about 60% to about 84% by weight.

11. The composition of claim 10, wherein the sulfur-containing solvent is present in an amount from about 66% to about 76% by weight.

12. The composition of claim 11, wherein the sulfur-containing solvent is present in an amount from about 70% to about 72% by weight.

13. The composition of claim 1, which is further substantially free of water.

14. The composition of claim 1, which is further substantially free of one or more of the following: additional amines, additional corrosion inhibitors, additional chelating agents, additional surfactants, additional organic solvents, additional acids, and additional bases.

15. The composition of claim 1, further comprising up to about 10% by weight of water.

16. A cleaning or photoresist stripping composition consisting essentially of:

(a) from about 5% to about 50% by weight of a polar aprotic nitrogen-containing solvent having a dipole moment of more than about 3.5;

(b) from about 0.2% to about 20% by weight of a choline derivative selected from the group consisting of a bis-choline salt, a tris-choline salt, and a mixture thereof; and (c) from about 50% to about 94% by weight of a sulfur-containing solvent selected from the group consisting of a sulfoxide, a sulfone, and a mixture thereof.

17. The composition of claim 16, wherein the polar aprotic nitrogen-containing solvent comprises N-methyl-2-pyrrolidone.

18. The composition of claim 16, wherein the polar aprotic nitrogen-containing solvent is present in an amount from about 15% to about 35% by weight.

19. The composition of claim 18, wherein the polar aprotic nitrogen-containing solvent is present in an amount from about 20% to about 30% by weight.

20. The composition of claim 16, wherein the choline derivative is present in an amount from about 0.5% to about 10% by weight.

21. The composition of claim 20, wherein the choline derivative is present in an amount from about 1% to about 5% by weight.

22. The composition of claim 16, wherein the sulfur-containing solvent comprises dimethyl sulfoxide, methyl sulfoxide, or a mixture thereof.

23. The composition of claim 22, wherein the sulfur-containing solvent is present in an amount from about 60% to about 84% by weight.

24. The composition of claim 23, wherein the sulfur-containing solvent is present in an amount from about 66% to about 76% by weight.

25. The composition of claim 1 comprising from about 0.2% to about 20% by weight of a hydroxide or salt of bis-(2-hydroxy-ethyl)-dimethyl ammonium and further comprising 2-(2-aminoethylamino)ethanol.

26. The composition of claim 1 further comprising 2-(2-aminoethylamino)ethanol.

27. The composition of claim 16 comprising from about 0.2% to about 20% by weight of a hydroxide or salt of bis-(2-hydroxy-ethyl)-dimethyl ammonium.

* * * * *